(12) United States Patent
Blackburn et al.

(10) Patent No.: US 7,049,751 B2
(45) Date of Patent: May 23, 2006

(54) TERMINATION OF SECONDARY FREQUENCIES IN RF POWER DELIVERY

(75) Inventors: Thomas Joel Blackburn, Fort Collins, CO (US); Christopher C. Mason, Fort Collins, CO (US)

(73) Assignee: Advanced Energy Industries, Inc, Fort Collins, CO (US)

( * ) Notice: Subject to any disclaimer, the term of this patent is extended or adjusted under 35 U.S.C. 154(b) by 0 days.

(21) Appl. No.: 11/090,377

(22) Filed: Mar. 25, 2005

(65) Prior Publication Data

US 2005/0168152 A1   Aug. 4, 2005

Related U.S. Application Data

(63) Continuation-in-part of application No. 10/621,695, filed on Jul. 16, 2003, now Pat. No. 6,888,313.

(51) Int. Cl.
    *H01J 7/24* (2006.01)
(52) U.S. Cl. .............................. 315/111.21; 315/111.51; 324/652; 324/637; 204/298.08
(58) Field of Classification Search .......... 315/111.21, 315/111.51, 111.71, 224, 291, 307; 702/57, 702/60, 64, 75; 204/192.13, 298.08; 219/121.54, 219/121.34–121.36, 121.43; 324/652, 637; 156/345.48; 118/723 I
See application file for complete search history.

(56) References Cited

U.S. PATENT DOCUMENTS

| | | | |
|---|---|---|---|
| 4,284,490 A | * | 8/1981 | Weber .................... 204/298.08 |
| 5,288,971 A | | 2/1994 | Knipp |
| 5,325,019 A | * | 6/1994 | Miller et al. ............ 315/111.21 |
| 5,339,039 A | | 8/1994 | Carlile et al. |
| 5,523,955 A | * | 6/1996 | Heckman ..................... 702/64 |
| 5,556,549 A | * | 9/1996 | Patrick et al. ................. 216/61 |
| 5,747,935 A | | 5/1998 | Porter et al. |
| 5,770,982 A | * | 6/1998 | Moore ......................... 333/32 |
| 5,849,136 A | | 12/1998 | Mintz et al. |
| 5,889,252 A | | 3/1999 | Williams et al. |
| 6,028,285 A | | 2/2000 | Khater et al. |
| 6,326,584 B1 | * | 12/2001 | Jewett et al. .......... 219/121.57 |
| 6,345,588 B1 | | 2/2002 | Stimson |
| 6,388,382 B1 | | 5/2002 | Doi et al. |
| 6,592,710 B1 | | 7/2003 | Benjamin et al. |
| 6,758,948 B1 | | 7/2004 | Johnson |
| 6,781,317 B1 | * | 8/2004 | Goodman ............... 315/111.21 |

* cited by examiner

*Primary Examiner*—Haissa Philogene
(74) *Attorney, Agent, or Firm*—John D. Pirnot

(57) ABSTRACT

There is provided a secondary reactive termination circuit connected between the output of the RF power generator and the input of the plasma chamber to allow the tight regulation or limiting of the voltage and current components of the secondary frequencies within the process plasma. The secondary reactive circuit controls the impedance of the match network designed primarily to operate at the fundamental frequency of the RF power generator as seen by secondary frequencies in the system. Power delivery components are measured at the connection point of the termination circuit and used as feedback signals to control variable values of the termination circuit components.

18 Claims, 2 Drawing Sheets

TERMINATION OF SECONDARY FREQUENCIES IN RF POWER DELIVERY

RELATED APPLICATIONS

This is a continuation-in-part of U.S. patent application Ser. No. 10/621,695 filed Jul. 16, 2003, now U.S. Pat. No. 6,888,313.

BACKGROUND OF THE INVENTION

1. Field of the Invention

This invention relates generally to apparatus for matching the variable impedance of a load, and more particularly to apparatus and methods for RF power delivery systems for plasma processes.

2. Brief Description of the Prior Art

In plasma processing applications, such as the manufacture of semiconductors or flat panel displays, RF power generators apply a voltage to a load in a plasma chamber and may operate over a wide range of frequencies. The impedance of a processing plasma can vary with the frequency of this applied voltage, chamber pressure, gas composition, and the target or substrate material. Consequently, a reactive impedance matching network is typically used to transform the chamber impedance to an ideal load for the RF power generator.

Multiple frequencies are always present in RF plasma processing systems. These different frequencies can be the result of harmonics of the fundamental operational frequency. In many applications, multiple frequencies can be the result of separate power delivery systems operating on the same tool. Common configurations on commercial plasma processing tools include, but are not limited to, dual frequency systems such as 13.56 MHz-350 kHz, 60 MHz-2 MHz, and 27.12 MHz-2 MHz. Due to the presence of different frequencies, it may be necessary to provide additional RF circuitry in components designed primarily to work within one frequency range to effect their termination impedance as seen by a separate frequency. Controlling this termination impedance would allow the control or limiting of the voltage and current components of the secondary frequencies within the process plasma. Circuitry intended to terminate secondary frequencies must be designed such that it provides the desired termination impedance to the secondary frequencies without adversely affecting the performance of the component within its primary frequency range of operation.

It would be desirable if there were provided an impedance matching network that had the capability to set specific termination impedances for different frequencies within RF components on a plasma chamber that gave the operator the advantage of being able to tightly regulate the voltage, current, and power within a process at discrete frequencies without concern for impedance variability induced by other components in the system.

It would also be desirable if the matching network had the capability to suppress any undesirable effects caused by harmonics of the fundamental operational frequency.

SUMMARY OF THE INVENTION

There is provided by this invention the addition of a termination circuit to matching network apparatus that allows tight control and repeatability of load impedance as seen by the network operating at secondary frequencies. This secondary circuit is designed in such a way that it does not cause undesirable interference, through conduction or radiation, with the operation of the match network at its fundamental operating frequency. The reactive, resonant termination circuit may be fixed or adjustable as required by the frequency application.

DETAILED DESCRIPTION

Figure 1:
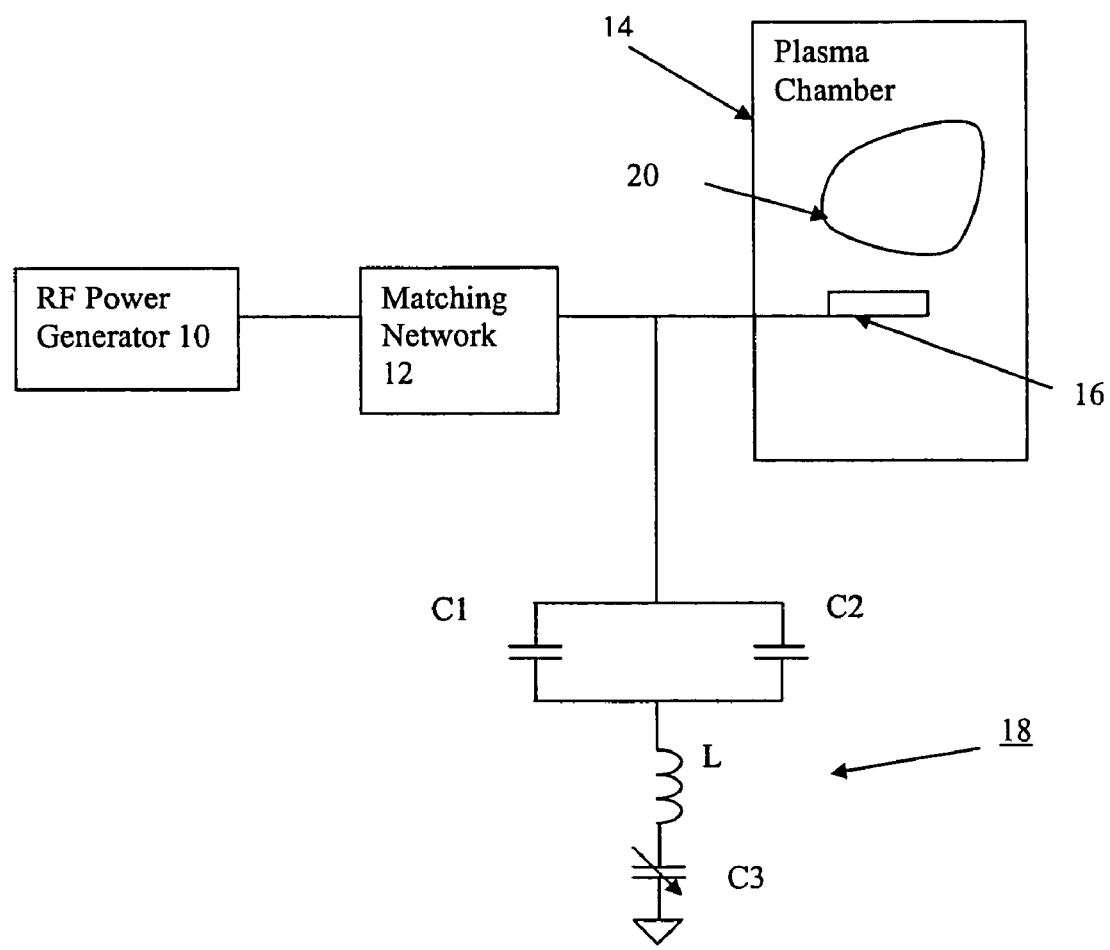
FIG. 1 illustrates plasma apparatus in accordance with one embodiment of this invention.

Referring to FIG. 1 there is shown RF plasma processing apparatus that incorporates the principles of this invention that is generally comprised of an RF power generator 10 that supplies power to a substrate 16 mounted in a plasma chamber 14 in a manner well known to those skilled in the art. The chamber 14 is filled with a gas that ignites into plasma for depositing thin films on or etching material from the substrate 16. The matching network 12 is designed to provide an efficient transfer of power from the RF power generator 10 to the RF plasma load 20 in the chamber by matching the different impedances between the generator 10 and plasma load 20 at the fundamental frequency of the RF power generator 10. A secondary termination circuit 18 is added between RF power generator 10 and the input of the plasma chamber 14 to provide specific impedance at a frequency or frequencies other than the fundamental operational frequency of the power generator and match network. The circuit 18 is generally comprised of parallel capacitors C1 and C2 series connected to an inductor L and a variable capacitor C3. Alternatively, any of the individual components of circuit 18 may be variable as well in order to adjust the termination frequency or frequencies of the circuit.

Figure 2:
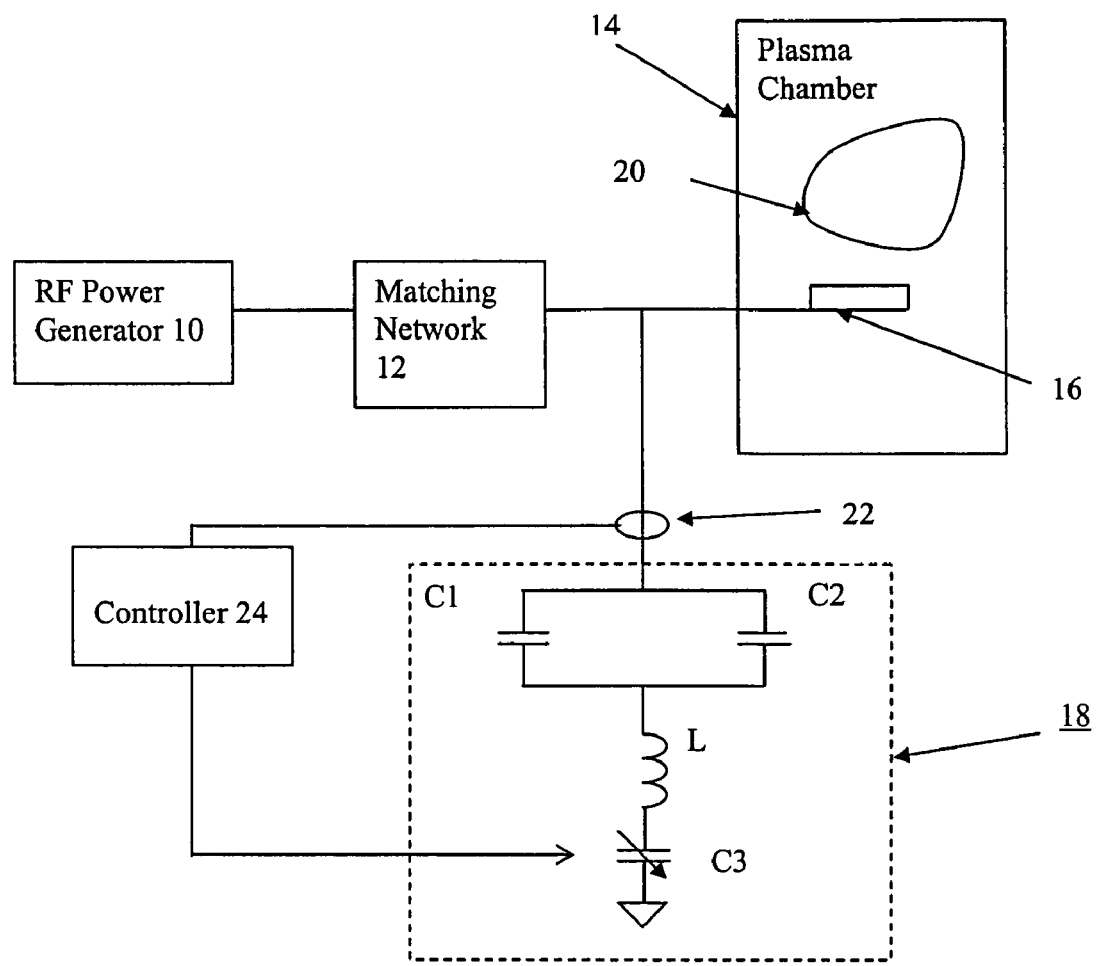
FIG. 2 illustrates plasma apparatus in accordance with an alternative embodiment of the invention.

During operation of the RF plasma processing apparatus, termination circuit 18 functions to regulate or limit the voltage, current, power and/or phase components of a secondary frequency within the processing system. By measuring any or all of these properties at a point of connection within the termination circuit during operation, further regulation or control of secondary frequency components is realized. FIG. 2 illustrates an embodiment of the invention employing a feedback loop to adjust and control component values of a termination circuit 18. Measurement device 22 measures voltage, current, and/or phase components of RF power delivery at the point of connection of termination circuit 18 to the output of match network 12. Alternatively, measurements may be obtained at any point within termination circuit 18. Data from measurement device 22 is provided to controller 24 which monitors power delivery properties at frequencies other than the fundamental operational frequency of the power generator and match network. Controller 24 further uses data from measurement device 22 as a feedback signal to vary the capacitance value of variable capacitor C3. Alternatively, any or all of the components of the termination circuit are variable and adjusted in response to data from measurement device 22.

It can readily be seen that there is provided herein a novel and unique implementation of a match network in an RF plasma processing system that utilizes an auxiliary resonant, reactive circuit that allows the control or limiting of the voltage and current components of secondary frequencies within the process plasma.

Although there is illustrated and described specific structure and details of operation, it is clearly understood that the same were merely for purposes of illustration and that changes and modifications may be readily made therein by those skilled in the art without departing from the spirit and the scope of this invention.

We claim:

1. A system for delivering RF power to a plasma, comprising:
    a) an RF power generator disposed to deliver power to a plasma within a plasma chamber;
    b) an impedance matching network disposed at the output of the RF power generator to provide efficient transfer of power from the RF power generator to the plasma at a fundamental operating frequency of the generator; and
    c) a termination circuit disposed between the RF power generator and the plasma chamber to regulate power delivery to the plasma at one or more secondary frequencies within the plasma.

2. The system of claim 1 wherein the termination circuit is a reactive circuit.

3. The system of claim 2 wherein reactive properties of the termination circuit are variable.

4. The system of claim 3 wherein the termination circuit comprises an inductor in series with a variable capacitor.

5. The system of claim 1 wherein the termination circuit regulates one of voltage, current, phase angle, and power at the one or more secondary frequencies.

6. The system of claim 1 wherein the termination circuit limits power delivery to the plasma at the one or more secondary frequencies.

7. The system of claim 3, further comprising a measurement device that measures a property of the power delivery to the plasma at the one or more secondary frequencies.

8. The system of claim 7 wherein the measurement device measures at least one of voltage, current, phase angle, arid power at the one or more secondary frequencies.

9. The system of claim 7, further comprising a controller that adjusts one or more of the variable reactive properties of the termination circuit based upon the property of the power delivery to the plasma measured by the measurement device at the one or more secondary frequencies.

10. A method of delivering RF power to a plasma, comprising:
    a) providing a plasma processing system comprising an RF power generator, a plasma chamber for containing a plasma therein, and an impedance matching network disposed between the RF power generator and the plasma chamber;
    b) transferring power from the RF power generator to the plasma at a fundamental operating frequency of the generator; and
    c) regulating power delivery to the plasma at one or more secondary frequencies within the plasma using a termination circuit disposed between the RF power generator and the plasma chamber.

11. The method or claim 10 wherein the termination circuit is a reactive circuit.

12. The method of claim 11 wherein reactive properties of the termination circuit are variable.

13. The method of claim 12 wherein the termination circuit comprises an inductor in series wit a variable capacitor.

14. The method of claim 10 wherein the termination circuit regulates at least one of voltage, current, phase angle, and power at the one or more secondary frequencies.

15. The method of claim 10 wherein the termination circuit limits power delivery to the plasma at the one or more secondary frequencies.

16. The method of claim 12, further comprising the step of measuring a property of the power delivery to the plasma at the one or more secondary frequencies.

17. The method of claim 16 wherein the property of the power delivery to the plasma is one of voltage, current, phase angle, and power.

18. The method of claim 16, further comprising the step of adjusting one or more of variable reactive properties of the termination circuit based upon the property of the power delivery to the plasma at the one or more secondary frequencies.

* * * * *